US006936954B2

(12) United States Patent
Peczalski

(10) Patent No.: US 6,936,954 B2
(45) Date of Patent: Aug. 30, 2005

(54) BULK RESONATOR

(75) Inventor: Andrzej Peczalski, Eden Prairie, MN (US)

(73) Assignee: Honeywell International Inc., Morristown, NJ (US)

(*) Notice: Subject to any disclaimer, the term of this patent is extended or adjusted under 35 U.S.C. 154(b) by 446 days.

(21) Appl. No.: 10/231,806

(22) Filed: Aug. 28, 2002

(65) Prior Publication Data

US 2003/0057806 A1 Mar. 27, 2003

Related U.S. Application Data

(60) Provisional application No. 60/315,862, filed on Aug. 29, 2001.

(51) Int. Cl.[7] ............................................. H01I 41/08
(52) U.S. Cl. ........................................ 310/346; 310/324
(58) Field of Search ............................... 310/346, 324, 310/328, 339, 338, 311, 320, 330, 332, 357; H01L 41/08, 24/82

(56) References Cited

U.S. PATENT DOCUMENTS

| 4,456,850 | A | * | 6/1984 | Inoue et al. ................. 310/324 |
| 4,573,027 | A | | 2/1986 | Buchalter et al. |
| 4,719,383 | A | | 1/1988 | Wang et al. |
| 5,004,987 | A | | 4/1991 | Hurley |
| 5,587,620 | A | | 12/1996 | Ruby et al. |
| 5,856,765 | A | | 1/1999 | Hermann |
| 6,131,256 | A | | 10/2000 | Dydyk et al. |
| 6,437,482 | B1 | * | 8/2002 | Shibata ....................... 310/320 |
| 6,441,539 | B1 | * | 8/2002 | Kitamura et al. ........... 310/346 |
| 6,720,844 | B1 | * | 4/2004 | Lakin ........................ 333/189 |

FOREIGN PATENT DOCUMENTS

GB          1 373 578          4/1972

OTHER PUBLICATIONS

Lakin, K.M., et al., "Temperature Compensated Bulk Acoustic Thin Film Resonators", IEEE Ultrasonics Symposium paper 3H–2, 4 pages, Oct. 24, 2000.

* cited by examiner

Primary Examiner—Thomas M. Dougherty
Assistant Examiner—Karen Addison
(74) Attorney, Agent, or Firm—Honeywell Int'l Inc.

(57) ABSTRACT

A resonator having temperature and electronic compensation. The resonator has several layers on a substrate having opposite thermal coefficients of the sound velocity for temperature compensation. Also, the frequency of the resonator is adjusted in accordance with an external time reference. The resonator has a high quality factor and a very small size.

44 Claims, 5 Drawing Sheets

BULK RESONATOR

BACKGROUND

This application claims the benefit of U.S. Provisional Application No. 60/315,862, entitled "Bulk Resonator", filed Aug. 29, 2001, wherein such document is incorporated herein by reference.

The invention pertains to resonators and particularly to compensated resonators.

There is a need of very stable resonators for oscillators, filters and other components, specifically in the frequency range of about 0.3 GHz to 5 GHz. Also, small size and high quality factor (Q) are desired.

SUMMARY

The invention is a resonator that may be compensated in structure and electronically, e.g., with respect to the resonant frequency drift with temperature. The resonator may be of a bulk nature and be designed to have a high Q.

DESCRIPTION

Figure 1A:
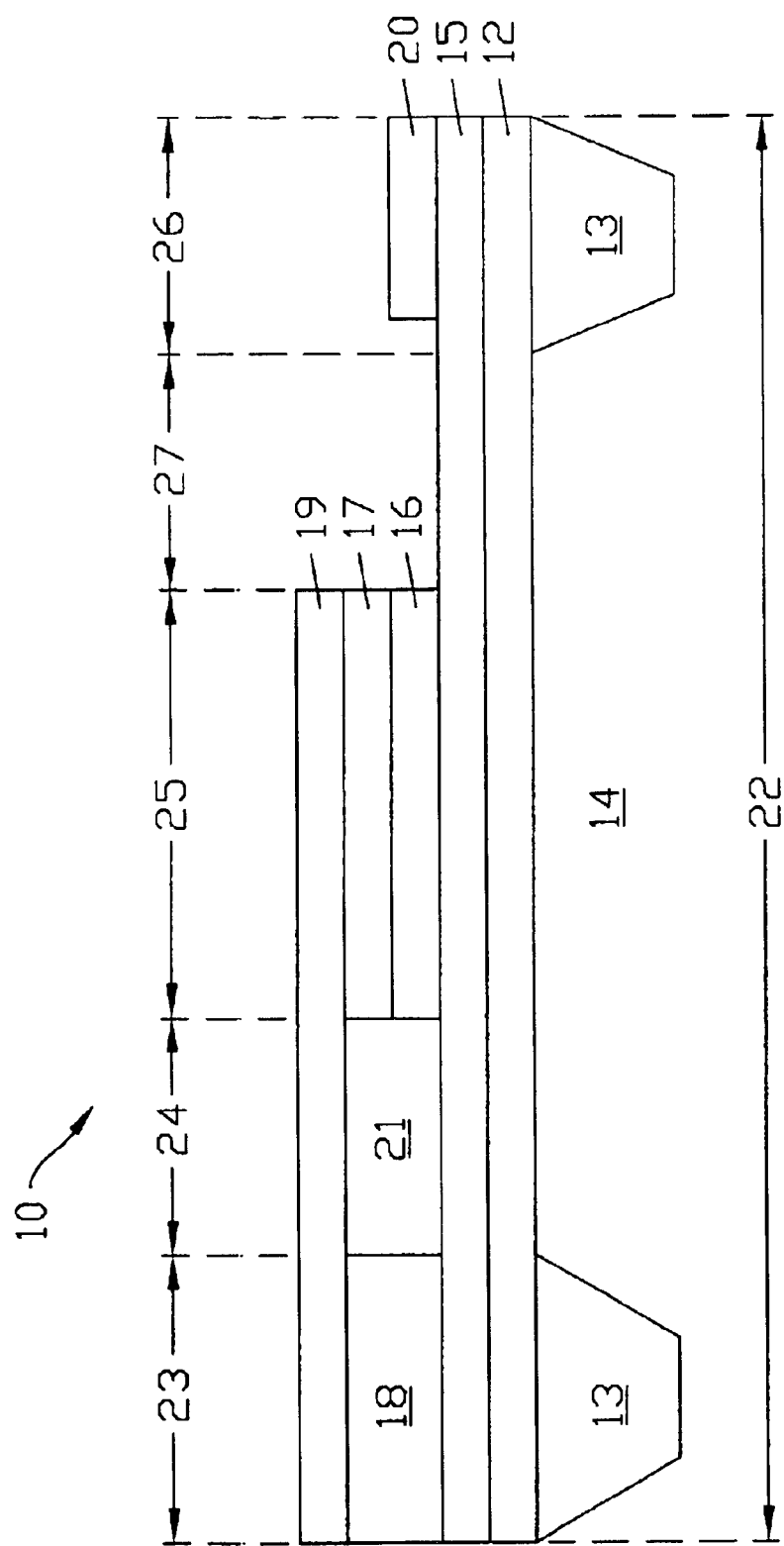
FIGS. 1a and 1b reveal illustrative embodiments of a resonator with structural compensation.
Figure 1B:
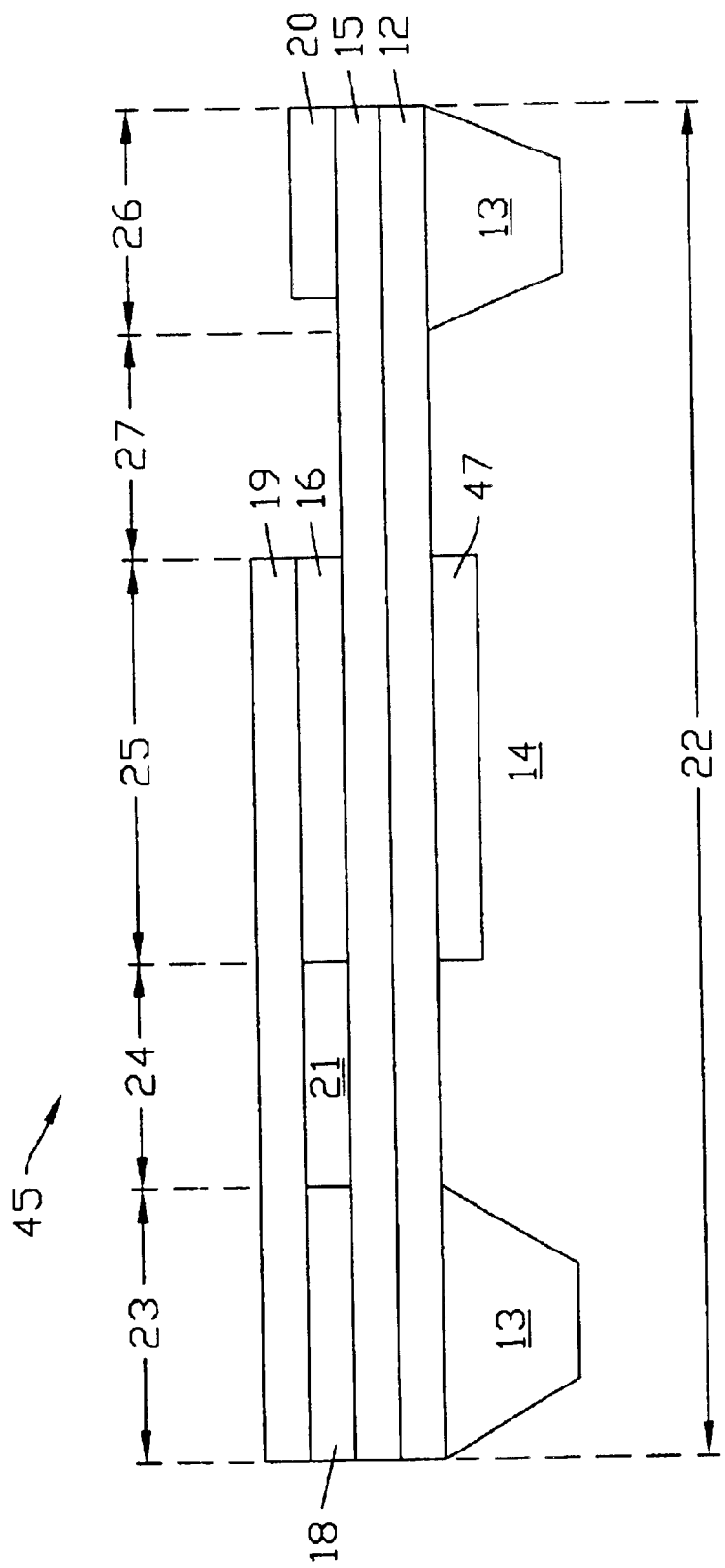

FIG. 1a shows an illustrative example of a bulk resonator 10. An $SiO_2$ layer 12 is part of or may be put on a silicon support 13. On layer 12 may be a layer 15 of silicon. On silicon layer 15 is a layer 16 of a piezoelectric material. Layer 16 may be GaN or AlN or a composite of AlGaN or a stack of multiple layers. Layer 16 may be made with an AlN seed layer, GaN, an alternating superlattice of AlN and GaN, then with more GaN on top. Or the layer may be a gradient which starts as AlN and ends up as GaN. On layer 16 is a layer 17 of an amorphous material. This material may be amorphous silicon, $SiO_2$ or silicon nitride. In an alternative embodiment 45, the layer 17 may be deposited as a layer 47 at the bottom of layer 12 instead, as shown in FIG. 1b. In resonators 10 and 45, on layer 15 is a layer 18 of $SiO_2$. In FIG. 1a, on and bridging layers 17 and 18 is a layer 19 of contact material for a contact for resonator 10. For resonator 45 of FIG. 1b, layer 19 bridges layers 16 and 18. This contact is an ohmic contact that may have material which is aluminum, doped silicon or amorphous silicon, or any electrically conductive material. A second contact is a layer 20 on the conducting layer 15. This contact is an ohmic contact that may have material which is aluminum, doped silicon or amorphous silicon, or any electrically conductive material. Between layer 18 and layers 16 and 17 of FIG. 1a is a space 21 which may be filled with air or a dielectric. Similarly, in FIG. 1b, space 21 between layers 16 and 18, under layer 19, may be filled with air or a dielectric. Or in resonators 10 and 45, space 21 may be a vacuum.

The size 22 of resonator may be about 75 microns. This dimension generally would be less than 2200 microns. In certain instances, dimension 22 could be more or less of the mentioned magnitudes. The ridge support 13 of layer 12 may be a square or a circle having a side dimension 22 or diameter 22, respectively. Layers 16 and 17 have opposite thermal coefficients of change of the sound velocity and thus reduce the change of frequency of resonator 10 due to temperature change of the resonator.

The thickness of layers 16 and 17 may each be between about one and ten microns. The dimensions for layer 47 may be about the same as either of these layers. In an illustrative example, each thickness may be about two microns for a possible resonator frequency of around 1.0 GHz. The thickness of layer 12 may be between 0.1 and 50 microns. Layer 15 may have a thickness between 0.01 and 10 micron. A value may be about 0.3 micron for layer 12 and about 0.2 micron for layer 15 of resonators 10 and 45. Length 23 of layer 18 may be between 20 and 50 microns with a value of 30 microns for resonators 10 and 45. Length 23 may be from the outside edge of the device to the inside edge of support 13. Length 25 of layers 16 and 17 may be between 20 and 2000 microns with a value of 50 microns for resonator 10. These dimensions may be applicable to layers 16 and 47 for resonator 45.

The thickness of contact 19 may between 0.1 and 0.5 micron. That thickness may be 0.3 if aluminum is used. If contact 19 is amorphous silicon, which may be doped to be conductive, the thickness may be 0.5 microns but could be one micron. Length 24 of space 21 between layer 18 and layers 16 and 17 may be 10 microns but could vary between 0.2 and 20 microns. Space 21 may have a similar length in resonator 45.

Contact layer 20 may have a length 26 of about 4 to 30 microns but could be another length up to 50 microns, or it could be much smaller (i.e., even sub micron) if another non-contacting metal layer (e.g., a via) is used to bring the signal out to a larger pad. A length 27 between layer 20 and layer 16 may be between 1 and 10 microns but for the illustrative examples it may be about 4 microns. Generally, lengths 27 and 24 may be about the same, and may be the length between the edge of layer 16 or 47 and the inside edge of support 13 as shown in FIGS. 1a and 1b. Space 21 may be filled with air but it could be filled with a dielectric such as $SiO_2$, or be a vacuum as noted above. Layer 18 may be an insulating material, such as silicon or sapphire instead of $SiO_2$, since insulation is a purpose of layer 18. Physical characteristics noted above may be applicable to all illustrative examples disclosed here where compatible.

Figure 2A:
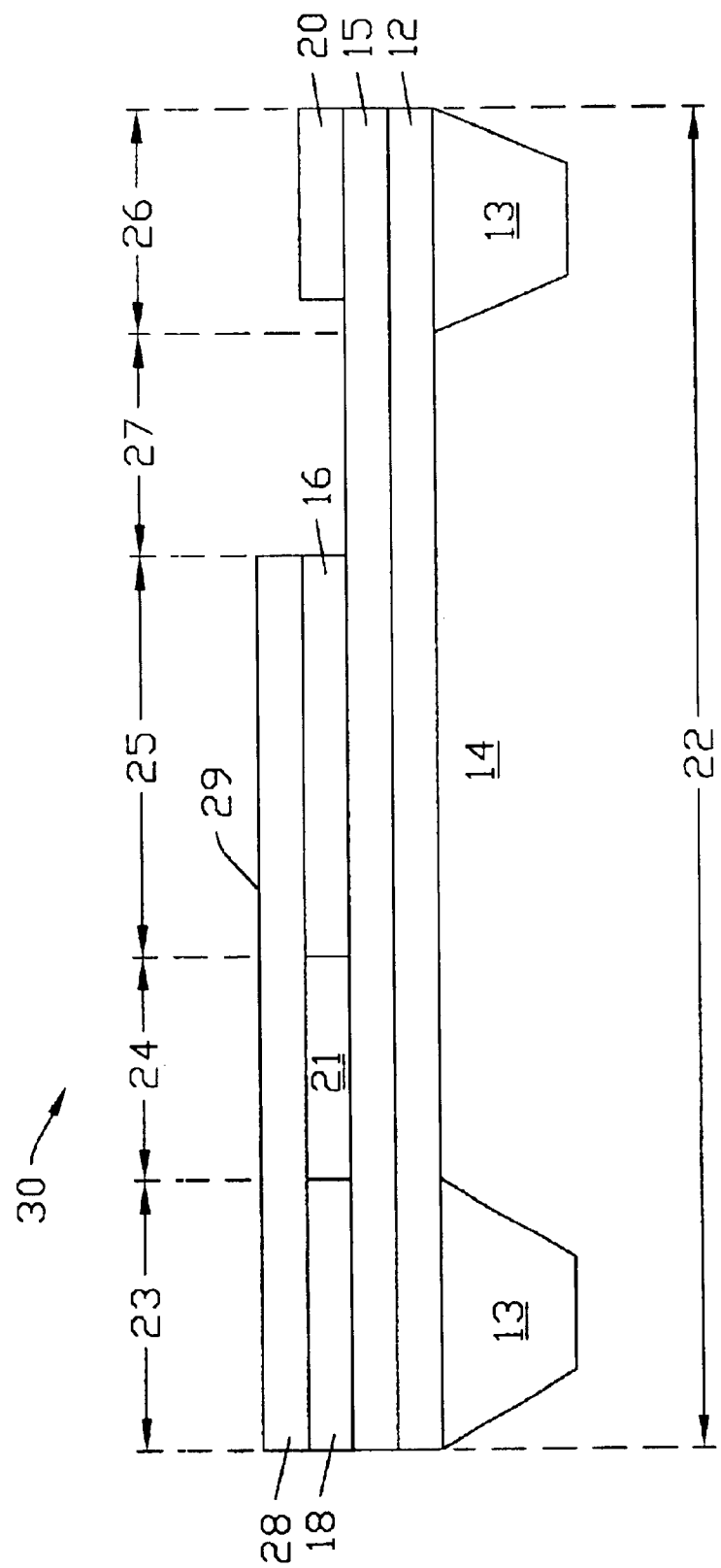
FIGS. 2a and 2b show other illustrative embodiments of the resonator with structural compensation.
Figure 2B:
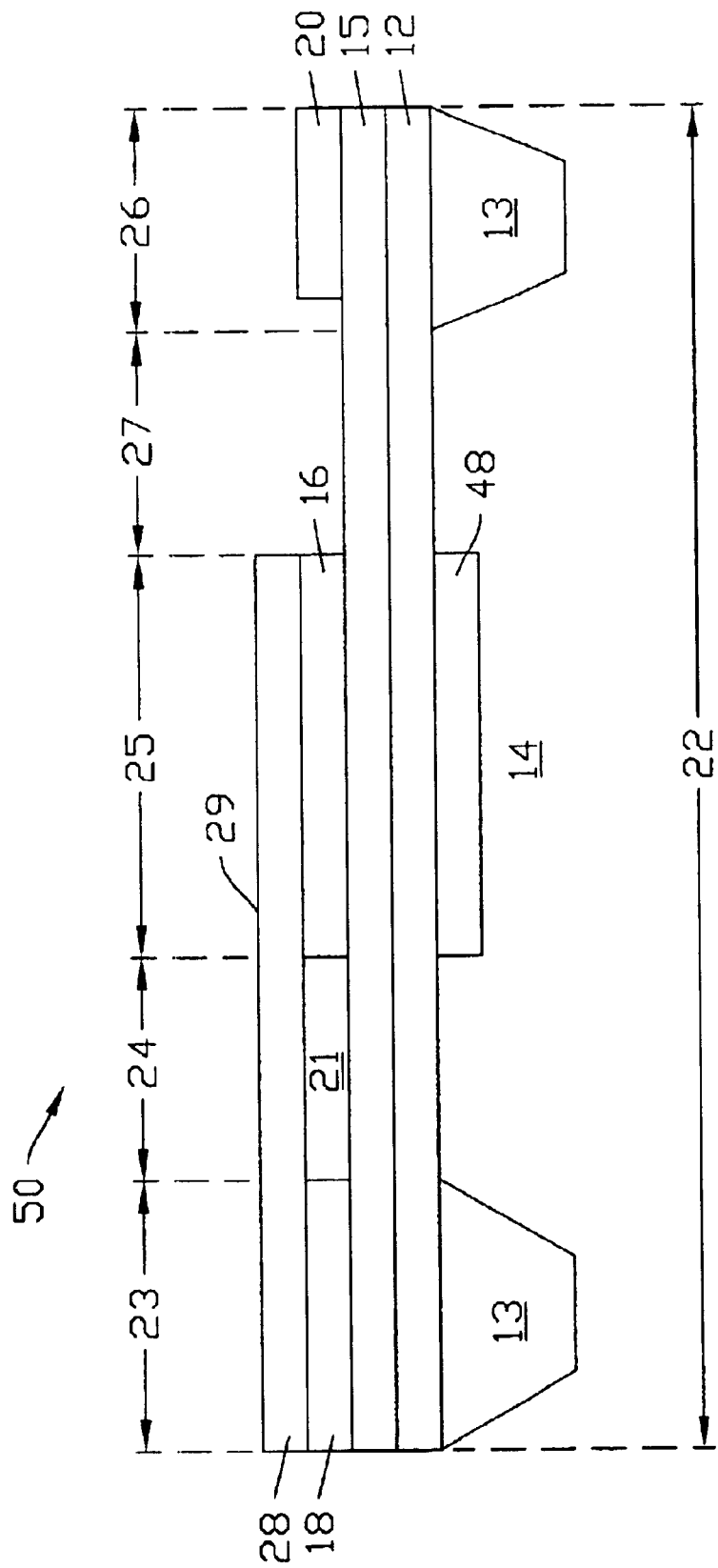

FIGS. 2a and 2b show illustrative embodiment of resonator 30 and 50 where in lieu of layer 17 and contact layer 19 of FIG. 1a, a layer 28 may be substituted. Layer 28 may extend from the right edge of layer 16 to the left edge of layer 18. The thickness of layer 18 may be about the same thickness as layer 16 since it appears more convenient to draw it that way, but it is not necessary for layer 18 to be the same thickness as layer 16. This may apply to resonator 45 in FIG. 1b, and to resonator 10 with respect to layers 16 and 17 relative to layer 18 in FIG. 1a. The thickness of space 21 may be about the same as the thickness of layer 16 of resonators 30 and 50. Layer 28 may be of the same material for resonators 30 and 50, that is, amorphous silicon. Layer 28 has a thermal coefficient of variation of velocity of sound that is the opposite of the coefficient of layer 16. The length of layer 28 may be about 90 microns but could be a length between about 20 microns and 2100 microns. Layer 28 may be utilized as a contact layer in that the top surface 29 of layer 28 or the whole thickness of layer 28 may be doped so as to be conductive for purposes of a contact for resonators 30 and 50. Space 21 may be filled with air, $SiO_2$ or some other dielectric. It may be a vacuum instead. Layer 18 may have $SiO_2$ substituted with sapphire or silicon nitride. The other structural and material aspects not noted specifically about embodiments 30 and 50 may be similar to those aspects of embodiments 10 and 45.

A feature of resonator 50 of FIG. 2b, not shown in resonator 30 of FIG. 2a, is a layer 48. Layer 48 may have length and thickness dimensions similar to those of layer 16. It may have a vertical alignment with layer 16. Layer 48 of resonator 50 may have certain characteristics similar to those of layer 47 of resonator 45 and/or those of layer 28 of resonator 50.

Figure 3:
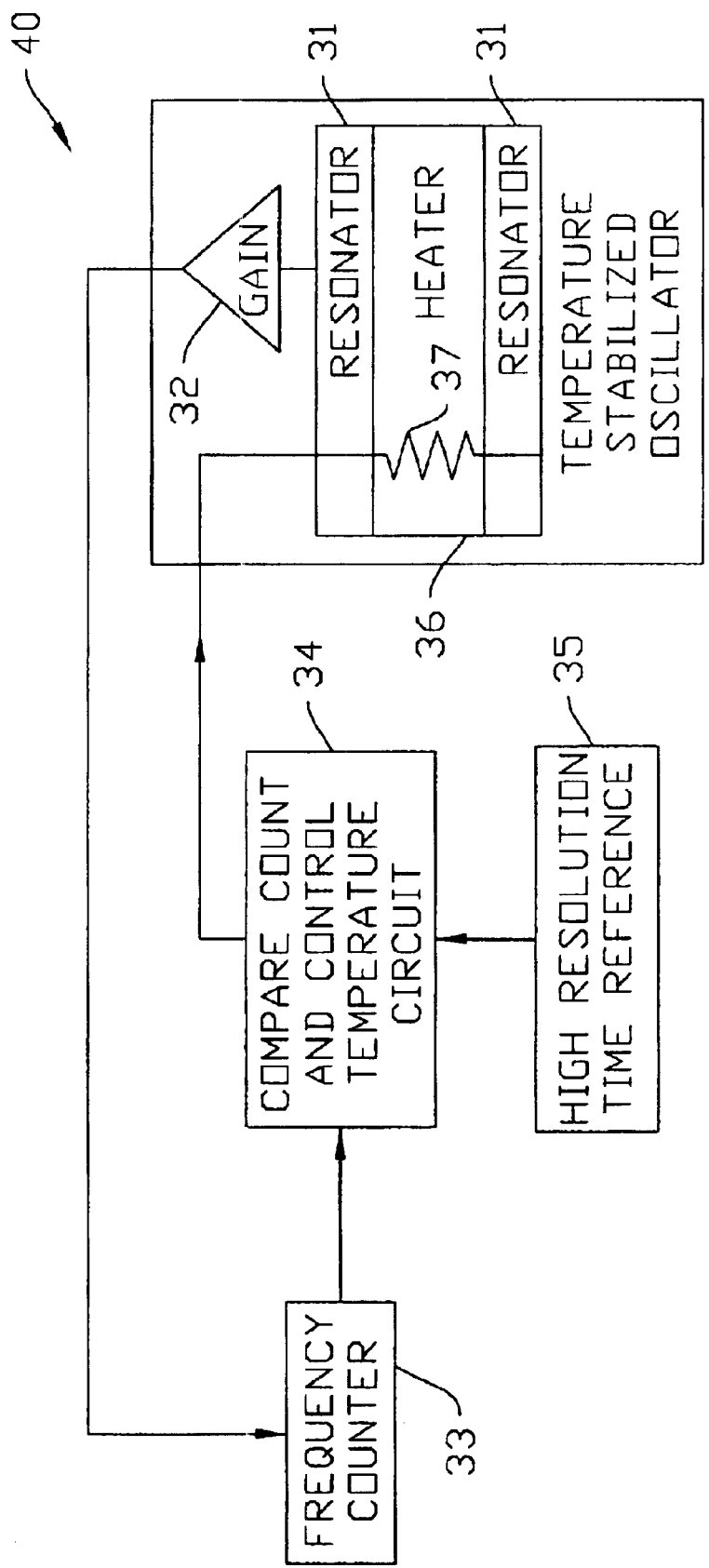
FIG. 3 is a schematic of electronic compensation for resonator.

Temperature compensation of another kind besides the opposite coefficients of certain layers in resonators 10, 30, 45 and 50, may be achieved in parallel or alternatively. That kind is electronic compensation as shown with an illustrative example 40 in FIG. 3. An output of resonator 31 may be amplified by amplifier 32. The output of amplifier 32, which may be a periodic waveform at the resonator frequency, may go to a frequency counter 33. Frequency counter 33 counts the periodic cycling of the signal from amplifier 32 over a set period of time. For example, a count for a duration of one second could be a common indication of the frequency of a device such as resonator 31. The count from counter 33 may go to a compare count and control circuit 34. Another input to circuit 34 may be from a high resolution time reference 35. One illustrative example of a time reference is a Global Positioning System (GPS) acquisition period or time which may occur every 30 seconds. The state of frequency counter 33 may be checked at equal time intervals, each of which may be determined by the GPS protocol. The state of the counter may be compared to a present time reference value, which is indicative of a preferred frequency of resonator 31. If there is a difference between the state of counter 33 and the present value, then the frequency of resonator 31 may be adjusted.

For adjustment of the frequency of resonator 31, a DC current may be applied to contacts 19 and 20 of embodiments 10 and 45 or to contacts 20 and 28 of embodiments 30 and 50 of resonator 31. Internally to the layers 16 and 17, or layers 16 and 28, there is a resonator resistance 37 that heats resonator 31. In some embodiments, the piezoelectric layer may have some leakage (e.g., resistance) which may be used to resistively heat resonator 31. Alternatively, or in addition, one or more heating resistor(s) 36 may be provided in thermal communication with resonator 31. For example, a heating resistor may be provided on a top 29 of the top contact layer 28. In either case, a transistor or the like may be used to adjust the current in the heating resistor(s) to tune the resonant frequency of the resonator 31. The power requirements of resonator 31 may be reduced by providing resonator 31 on a thin diaphragm and/or in a vacuum package, both of which may reduce the thermal dissipation and mass of resonator 31.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A resonator comprising:
    a first layer of dielectric;
    a second layer of silicon formed on said first layer of dielectric;
    a third layer of a piezoelectric material formed on a first portion of said second layer;
    a fourth layer of amorphous material formed on said third layer or the bottom of said first layer of dielectric;
    a fifth layer formed on a second portion of said second layer;
    a first contact layer formed on said fourth and fifth layers; and
    a second contact formed on a third portion of said second layer.

2. The resonator of claim 1, further comprising:
    a frequency counter connected to said first and second contacts;
    a heater thermally proximate to said resonator;
    a reference time source; and
    a compare count and adjust heater device, connected to said frequency counter, said heater and to said reference time source.

3. The resonator of claim 2, wherein:
    said first layer is $SiO_2$;
    said third layer is of a piezoelectric group including GaN, AlN and AlGaN;
    said fourth layer is of amorphous material group including $SiO_2$, silicon nitride and amorphous silicon;
    said fifth layer is $SiO_2$;
    said first contact layer is an electrically conducting material; and
    said second contact layer is electrically conducting material.

4. The resonator of claim 3, wherein said third and fourth layers have opposite thermal coefficients of sound velocity.

5. The resonator of claim 4, wherein said compare count and adjust heater device compares a resonator frequency count indication from said frequency counter with said reference time source and sends a signal to said heater that heats or not heats said resonator to change a frequency of said resonator so as to adjust the frequency to match a corresponding value of said frequency counter output to said time reference source.

6. The resonator of claim 4, wherein:
    said reference time source provides a signal periodically after a given period of time;
    said frequency counter periodically provides a count of oscillations of said resonator during the given period of time; and
    said compare count and adjust heater device compares the count with a predetermined count and sends a signal to said heater which in turn adjusts the count of oscillations of said resonator.

7. A resonator comprising:
    a first layer of dielectric material;
    a second layer of the first material on said first layer;
    a third layer of piezoelectric material on said second layer; and
    a fourth layer of amorphous material on said third layer.

8. The resonator of claim 7, wherein said third layer is on a first portion of said second layer.

9. The resonator of claim 8, further comprising a fifth layer of dielectric on a second portion of said second layer.

10. The resonator of claim 9 further comprising a first contact layer on at least a portion of said fifth layer and said fourth layer.

11. The resonator of claim 10, further comprising a second contact layer on at least a portion of said second layer.

12. The resonator of claim 9 wherein said fourth layer is on said fifth layer.

13. The resonator of claim 12 further comprising a contact on said second layer.

14. The resonator of claim 13, wherein said fourth layer is a contact.

15. The resonator of claim 9, further comprising:
a heater proximate to said resonator;
a frequency sensor proximate to said resonator;
a frequency counter connected to said frequency sensor; and
a control device connected to said frequency counter and to said heater.

16. The resonator of claim 15, wherein said control device is connected to a time reference.

17. The resonator of claim 16, wherein:
a first count of a predetermined frequency, during a given period of the time reference, may be compared by said control device with a second count of a frequency of said resonator from said frequency counter; and
said control device may change the frequency of said resonator by changing the temperature of said resonator via said heater, so that the first and second counts are approximately equal.

18. The resonator of claim 17, wherein said heater is part of said resonator.

19. The resonator of claim 18, wherein said resonator may be heated by applying a current to said resonator.

20. The resonator of claim 9, further comprising:
a frequency counter connected to said resonator; and
a control device connected to said frequency counter, to said resonator, and to a time reference.

21. The resonator of claim 20, wherein:
a first count of a predetermined frequency, during a given period of the time reference, may be compared by said control device with a second count from said frequency counter of a frequency of said resonator; and
said control device may change the frequency of said resonator so that the first and second counts are approximately equal.

22. The resonator of claim 21, wherein said control device may change the frequency of said resonator by applying a current to said resonator.

23. A resonator comprising:
means for resonating;
means for attaining a first count of a frequency of said means for resonating during a time reference period;
means for attaining a second count of a predetermining frequency during the time reference period; and
means for changing the frequency of said means for resonating so that the first count is approximately equal to the second count.

24. The resonator of claim 23, wherein said means for changing the frequency of said means for resonating comprises a means for affecting a temperature of said means for resonating.

25. The resonator of claim 24, wherein said means for resonating comprises:
a support structure;
a first layer, having dielectric material, on said support structure;
a second layer, having a first material, on said first layer;
a third layer, having piezoelectric material, on at least a portion of said second layer; and
a fourth layer, having an amorphous material, on said third layer.

26. The resonator of claim 25, wherein said means for resonating further comprises a fifth layer, having conductive material, between said second and third layers.

27. The resonator of claim 26, wherein said means for resonating further comprises a sixth layer, having dielectric material, on at least a portion of said second layer.

28. The resonator of claim 27, wherein said means for resonating further comprises a first contact layer on at least a portion of said sixth layer and said fourth layer.

29. The resonator of claim 28, wherein said means for resonating further comprises a second contact layer on at least a portion of said second layer.

30. The resonator of claim 27, wherein said fourth layer is on said sixth layer.

31. The resonator of claim 30, wherein said means for resonating comprises a contact on said second layer.

32. The resonator of claim 31, wherein said fourth layer is a contact.

33. The resonator of claim 32, wherein the first material is silicon.

34. The resonator of claim 29, wherein the first material is silicon.

35. A resonator comprising:
a support structure;
a first layer, having dielectric material, on said support structure;
a second layer, having a first material, on said first layer;
a third layer, having conductive material, on a portion of said second layer;
a fourth layer, having piezoelectric material, on a second portion of said second layer; and
a fifth layer, having amorphous material, on said fourth layer.

36. The resonator of claim 35, further comprising a sixth layer, having dielectric material, on a portion of said second layer.

37. The resonator of claim 36, further comprising:
a seventh layer, having contact material, on said fifth and sixth layers; and
an eighth layer, having contact material, on a portion of said second layer.

38. The resonator of claim 36, wherein said fifth layer has contact material.

39. The resonator of claim 38, further comprising a seventh layer, having contact material on a portion of said second layer.

40. The resonator of claim 37, further comprising a frequency stabilizer.

41. The resonator of claim 40, wherein said frequency stabilizer comprises:
a frequency counter connected to an output of said resonator; and
a compare count connected to an output of said frequency counter, an output of a time reference, and to an input of said resonator.

42. The resonator of claim 39, further comprising a frequency stabilizer.

43. The resonator of claim 42, wherein said frequency stabilizer comprises:
a frequency counter connected to an output of said resonator; and
a compare count connected to an output of said frequency counter, an output of a time reference, and an input of said resonator.

44. The resonator of claim 14, further comprising a sixth layer on the bottom of a portion of said first layer.

* * * * *